United States Patent
Tepman

(10) Patent No.: US 7,550,066 B2
(45) Date of Patent: Jun. 23, 2009

(54) STAGGERED TARGET TILES

(75) Inventor: Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 731 days.

(21) Appl. No.: 10/888,383

(22) Filed: Jul. 9, 2004

(65) Prior Publication Data

US 2006/0006058 A1    Jan. 12, 2006

(51) Int. Cl.
*C23C 14/34* (2006.01)
(52) U.S. Cl. .............. 204/192.12; 204/298.12; 204/298.13
(58) Field of Classification Search ............ 204/192.12, 204/298.12, 298.13
See application file for complete search history.

(56) References Cited

U.S. PATENT DOCUMENTS

| | | | | |
|---|---|---|---|---|
| 4,200,510 A | 4/1980 | O'Connell et al. | ...... | 204/192 R |
| 4,505,798 A | 3/1985 | Ramachandran et al. | .... | 204/298 |
| 4,966,676 A * | 10/1990 | Fukasawa et al. | ...... | 204/298.12 |
| 5,155,063 A * | 10/1992 | Ito | .............. | 438/637 |
| 5,190,630 A * | 3/1993 | Kikuchi et al. | ......... | 204/192.12 |
| 5,284,539 A | 2/1994 | McKernan et al. | .......... | 156/154 |
| 5,372,694 A | 12/1994 | Szczyrbowski | ........ | 204/298.12 |
| 5,466,355 A | 11/1995 | Ohhashi et al. | ........ | 204/298.13 |
| 5,507,897 A | 4/1996 | Campet et al. | ................ | 156/89 |
| 5,531,876 A * | 7/1996 | Saunders et al. | ....... | 204/298.12 |
| 5,536,380 A | 7/1996 | Ocker et al. | ........... | 204/298.09 |
| 5,558,751 A | 9/1996 | Mahler et al. | .......... | 204/298.26 |
| 6,093,293 A * | 7/2000 | Haag et al. | ............. | 204/298.12 |
| 6,199,259 B1 | 3/2001 | Demaray et al. | ............. | 29/458 |
| 2004/0056332 A1 | 3/2004 | Bachrach et al. | ............ | 257/649 |

FOREIGN PATENT DOCUMENTS

| | | |
|---|---|---|
| JP | 54-143780 | 9/1979 |
| JP | 1-247569 | 10/1989 |
| JP | 02-111878 | 4/1990 |
| JP | 05-230642 | 9/1993 |
| JP | 9-95782 | 4/1997 |
| JP | 9-67668 | 11/1997 |
| JP | 2000-328241 | 11/2000 |
| WO | WO 97/36020 | 10/1997 |

* cited by examiner

*Primary Examiner*—Rodney G McDonald
(74) *Attorney, Agent, or Firm*—Charles S. Guenzer

(57) ABSTRACT

A sputtering target, particularly for sputter depositing a target material onto large rectangular panels, in which a plurality of target tiles are bonded to a backing plate in a two-dimensional non-rectangular array such that the tiles meet at interstices of no more than three tile, thus locking the tiles against excessive misalignment during bonding. The rectangular tiles may be arranged in staggered rows or in a herringbone or zig-zag pattern. Hexagonal and triangular tiles also provide many of the advantages of the invention.

8 Claims, 4 Drawing Sheets

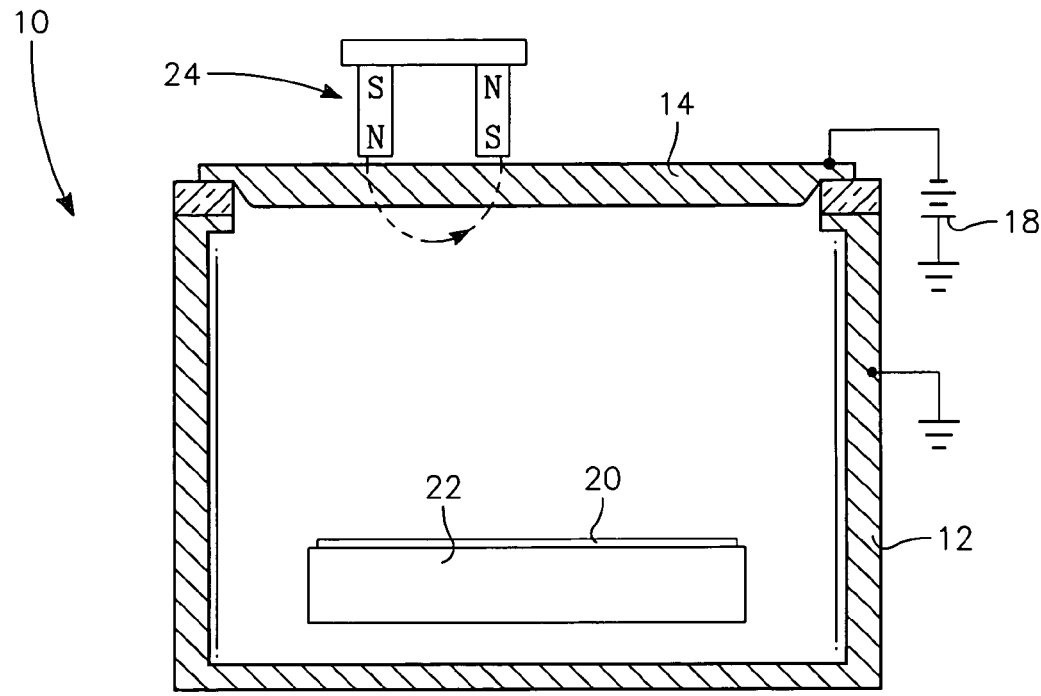
(PRIOR ART)
FIG. 1
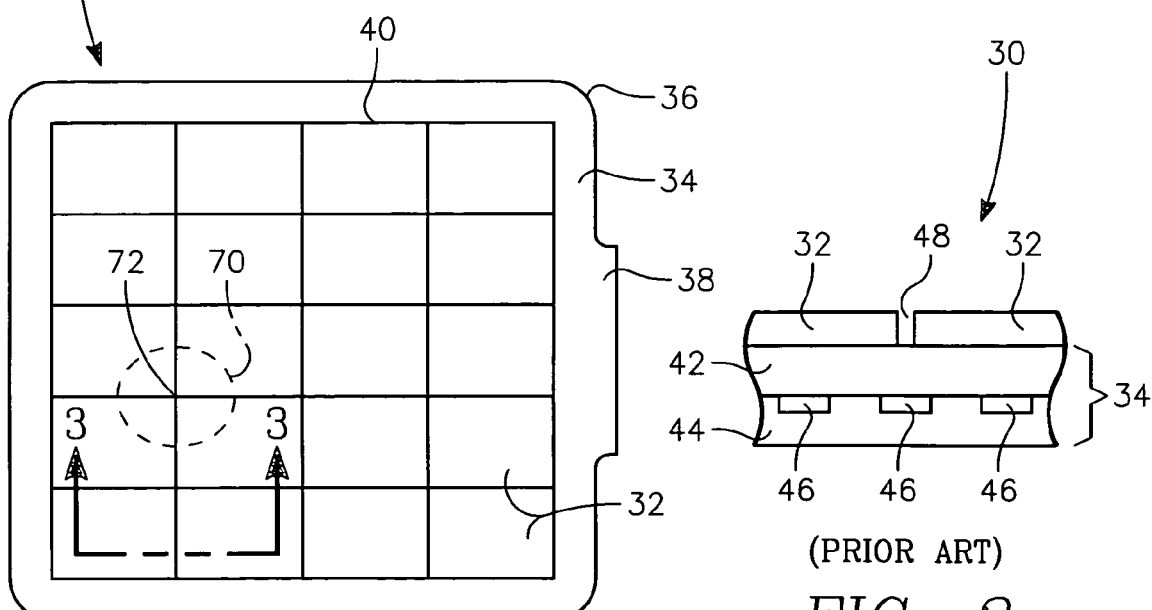
(PRIOR ART)
FIG. 2
(PRIOR ART)
FIG. 3

STAGGERED TARGET TILES

FIELD OF THE INVENTION

The invention relates generally to sputtering of materials. In particular, the invention relates to the a target containing multiple tiles of target material.

BACKGROUND ART

Sputtering, alternatively called physical vapor deposition (PVD), is widely used in the commercial of semiconductor integrated circuits for depositing layers of metals and related materials. A typical DC magnetron plasma reactor 10 illustrated in cross section in FIG. 1 includes an electrically grounded vacuum chamber 12 to which a target 14 is vacuum sealed through an electrical isolator 16. A DC power supply 18 negatively biases the target 14 with respect to the chamber 12 or a grounded spatter shield within the chamber 12 to excite an argon sputter working gas into a plasma. However, it is noted that RF sputtering is also known. The positively charged argon ions are attracted to the biased target 14 and sputter material from the target 14 onto a substrate 20 supported on a pedestal 22 in opposition to the target 14. A magnetron 24 positioned in back of the target 14 projects a magnetic field parallel to the front face of the target 14 to trap electrons, thereby increasing the density of the plasma and increasing the sputtering rate. In modem sputter reactors, the magnetron may be small and be scanned about the back of the target 14. Even a large magnetron may be scanned in order to improve the uniformity of erosion and deposition.

Although aluminum, titanium, and copper targets may be formed as a single integral member, targets for sputtering other materials such as molybdenum, chromium, and indium tin oxide (ITO) are more typically formed of a sputtering layer of the material to be sputtered coated onto or bonded to a target backing plate of less expensive and more readily machinable material.

Sputter reactors were largely developed for sputtering onto substantially circular silicon wafers. Over the years, the size of silicon wafers has increased from 50mm diameters to 300mm. Sputtering targets or even their layers of sputtering material need to be somewhat larger to provide more uniform deposition across the wafer. Typically, wafer sputter targets are formed of a single circular member for some materials such as aluminum and copper or a single continuous sputter layer formed on a backing plate for more difficult materials.

In the early 1990's, sputter reactors were developed for thin film transistor (TFT) circuits formed on glass panels to be used for large displays, such as liquid crystal displays (LCDs) for use as computer monitors or television screens. The technology was later applied to other types of displays, such as plasma displays and organic semiconductors, and on other panel compositions, such as plastic and polymer. Some of the early reactors were designed for panels having a size of about 400mm×600mm. It was generally considered infeasible to form such large targets with a single continuous sputter layer. Instead, multiple tiles of sputtering materials are separately bonded to a single target backing plate. In the original sizes of flat panel targets, the tiles could be made big enough to extend across the short direction of the target so that the tiles form a one-dimensional array on the backing plate.

Because of the increasing sizes of flat panel displays being produced and the economy of scale realized when multiple displays are fabricated on a single glass panel and thereafter diced, the size of the panels has been continually increasing. Flat panel fabrication equipment is commercially available for sputtering onto panels having a minimum size of 1.8m and equipment is being contemplated for panels having sizes of 2m×2m and even larger. For such large targets, a two-dimensional tile arrangement illustrated in plan view in FIG. 2 may become necessary. Rectangular target tiles 30 are arranged in a rectangular array and bonded to a target backing plate 32.

As shown in the plan view of FIG. 2, a substantially rectangular target 30 includes rectangular target tiles 32 arranged in a rectangular array and bonded to a target backing plate 34. The tile size depends on a number of factors including ease of fabricating the tiles and they may number 4×5, but the tiles 30 may be of substantial size, for example 75mm×90mm, such that a 3×3 array is required for a larger panel. The number of tiles in the tile array may be even greater if the target material is difficult to work with, such as chromium or molybdenum. The illustrated target backing plate 34 is generally rectangularly shaped to conform to the shape and size of the panel being sputter coated but its corners 36 are rounded to conform to the chamber body supporting it and it includes an extension 38 from the chamber body containing an electrical terminal for powering the target and pipe couplings for the cooling fluid used to cool the target 30. As illustrated in cross section in FIG. 3, the target backing plate 34 for flat panel sputtering is typically formed from two metal plates 42, 44, for example, of titanium welded or otherwise bonded together. One of the plates 42, 44 is formed with linear cooling channels 46 through which the cooling fluid circulates. This backing plate 34 is more complex than the usual backing plate for wafer processing since, for the very large panel sizes, it is desired to provide a backside vacuum chamber rather than the usual cooling bath so as to minimize the differential pressure across the very large target 30.

The tiles 32 are bonded to the backing plate 34 on its chamber side with a gap 48 possibly formed between the tiles 32. Typically, the tiles 32 have a parallelopiped shape with perpendicular corners with the possible exception of beveled edges at the periphery of the tile array. The gap 32 is intended to satisfy fabricational variations and may be between 0 and 0.5mm. Neighboring tiles 32 may directly abut but should not force each other. On the other hand, the width of the gap 48 should be no more than the plasma dark space, which generally corresponds to the plasma sheath thickness and is generally somewhat greater than about 0.5mm for the usual pressures of argon working gas. Plasmas cannot form in spaces having minimum distances of less than the plasma dark space. As a result, the underlying titanium backing plate 34 is not sputtered while the tiles 32 are being sputtered.

Returning to FIG. 2, the tiles 32 are arranged within a rectangular outline 40 conforming approximately to the area of the target 30 desired to be sputtered or somewhat greater. The magnetron 24 of FIG. 1 is scanned within this outline 40. Shields or other means are used to prevent the untiled surface of the backing plate 34 from being exposed to high-density plasma and be thereby sputtered. Clearly sputtering a titanium backing plate 34 supporting molydenum or other tiles is not desired. Even if the backing plate 34 is composed of the same material as the target tiles 32, sputtering of the backing plate 34 is not desired. The backing plate 34 is a complex structure and it is desired to refurbish it after one set of tiles 32 have been exhausted and to use it for a fresh set of tiles 32. Any sputtering of the backing plate 34 should be avoided.

The rectangular tile arrangement of FIG. 2 presents difficulties with increases in the panel size. There are several processes available for bonding target tiles to backing plates. One popular process illustrated in FIG. 4 includes an apparatus comprising two heating tables 60, 62. The tiles 32 are placed on one table 60 with their sputtering face oriented downwards. Each tile 32 is painted on its backside with a coating 64 of indium. The heating table 60 heats the coated tiles 32 to about 200° C., far above indium's melting point of 156° C. so that indium wets to the tiles 32 and forms a uniform molten layer. Similarly, the backing plate 34 is placed on the other heating table 62 and is painted with an indium coating 66 and is heated to about 200° C. With all indium coatings 64, 66 in their molten state, the tiles 32 are removed from the first table 60, inverted, and placed on top of the backing plate 34 with the melted indium coatings 64, 66 facing each other and the sputtering faces oriented upwards. Upon cooling, the indium solidifies and bonds the tiles 32 to the backing plate 34.

The transfer operation must be performed quickly enough that the indium coating 64 on the tiles 32 does not solidify during transfer. For smaller targets, the transferring could be done manually. However, with the target and tiles becoming increasingly larger, a transfer fixture grasps the edges of the tiles, and a crane lifts the fixture and moves it to the second table.

Such large mechanical structures are not easily manipulated to provide the desired degree of alignment, specifically, the bonded tiles being separated by no more than 0.5 mm. Instead, as illustrated for a corner area 40 between four tiles 32 in the plan view of FIG. 5, the four tiles 32 arranged in a rectangular array tend to slide along each other and be misaligned with different sizes for the inter-tile gaps 48. More importantly, an interstix 72 between the corners of the four tiles may become much larger than intended. By an interstix is meant a point or space at the interfaces between three or more tiles so that the term does not include the line between two tiles. Even a well defined interstix 72 presents the greatest gap between tiles 32. As a result, the widest point of the interstix 72 for misaligned tiles 32 may become larger than the plasma dark space, e.g., 1 mm, so that the plasma may propagate towards the backing plate 34. if the gap is only slight larger than the plasma dark space, the plasma state in the gap may be unsteady and result in intermittent arcing. Even if the arcing is confined to tile material, the arc is likely to ablate particles of the target material rather than atoms and create contaminant particles. If the plasma reaches the backing plate, it will be sputtered. Plate sputtering will introduce material contamination if the tiles and backing plate are of different materials. Furthermore, plate sputtering will make it difficult to reuse the backing plate for a reflurbished target. Even if the plasma does not immediately reach the backing plate, an oversized interstix 72 allows the plasma to sputter the sides of the tiles 32 facing the interstix 72. The side sputtering will further enlarge the interstix 72 and worsen the situation of plate sputtering.

A similar problem arises from the differential thermal expansion between the materials of the target tiles and the backing plate. When the bonded assembly is cooled to room temperature, the differential thermal expansion is likely to cause the assembly to bow. Because of the softness of solid indium, the bow can be pressed out of the bonded assembly. However, the pressing is a generally uncontrolled process and the tiles may slide relative to each other during the pressing to create the undesired tile arrangement of FIG. 5.

Techniques have been developed to bond tiles to backing plates with a conductive elastomer that can be applied at a much lower temperature. Such bonding services are available from Thermal Conductive Bonding, Inc. of San Jose, Calif. Nonetheless, elastomeric bonding does not completely eliminate the misalignment problem with larger array of target tiles.

SUMMARY OF THE INVENTION

A target, particularly useful as a rectangular target, includes rectangular target tiles which are bonded to a target backing plate in a non-rectangular two-dimension array.

The rectangular tiles may be arranged in staggered rows such that only three tiles meet at an interstix and only two of those tiles have acute corners adjacent to the interstix. In one embodiment of the row arrangement, one row may include only plural whole tiles while a neighboring row has one less whole tile and two half tiles on the ends. In another embodiment of the row arrangement, all rows include the same number of whole tiles and one partial tile with the partial tiles being disposed on opposed ends of neighboring rows.

The rectangular tiles may alternatively be arranged in a herringbone or zig-zag pattern of whole rectangular tiles having a 1:2 size ratio and square tiles disposed on the periphery of the rectangular outline.

Alternatively, the tiles may be hexagonally shaped and arranged in a close-packed structure.

Yet further alternatively, the tiles may be triangularly shaped, preferably having isosceles shapes within the interior of the rectangular outline.

BRIEF DESCRIPTION OF THE DRAWINGS

FIG. 1 is a schematic cross-sectional view of a conventional plasma sputter reactor.

FIG. 2 is a plan view of rectangular target formed from a two-dimensional array of target tiles.

FIG. 3 is a cross-sectional view of a conventional configuration of target tiles bonded to a target backing plate including cooling channels.

DETAILED DESCRIPTION OF THE PREFERRED EMBODIMENTS

Figure 4:
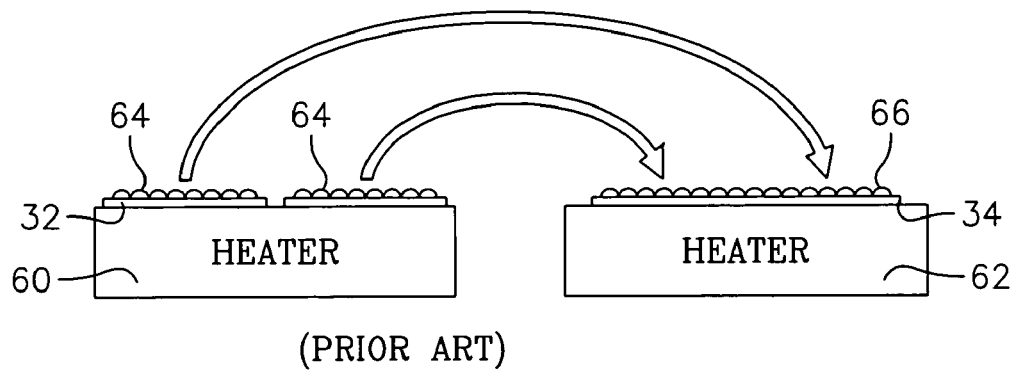
FIG. 4 is a schematic view illustrating a conventional method of bonding target tiles to a backing plate.
Figure 5:
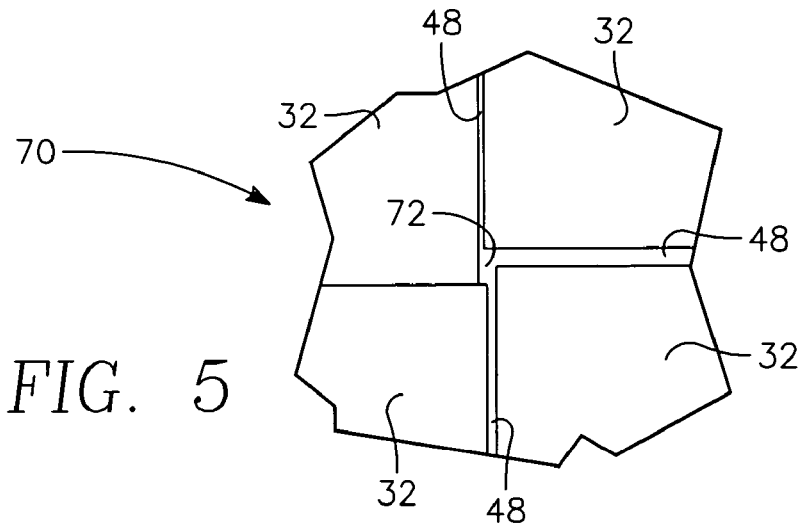
FIG. 5 is a plan view illustrating a problem with the conventional rectangular arrangement of target tiles.
Figure 6:
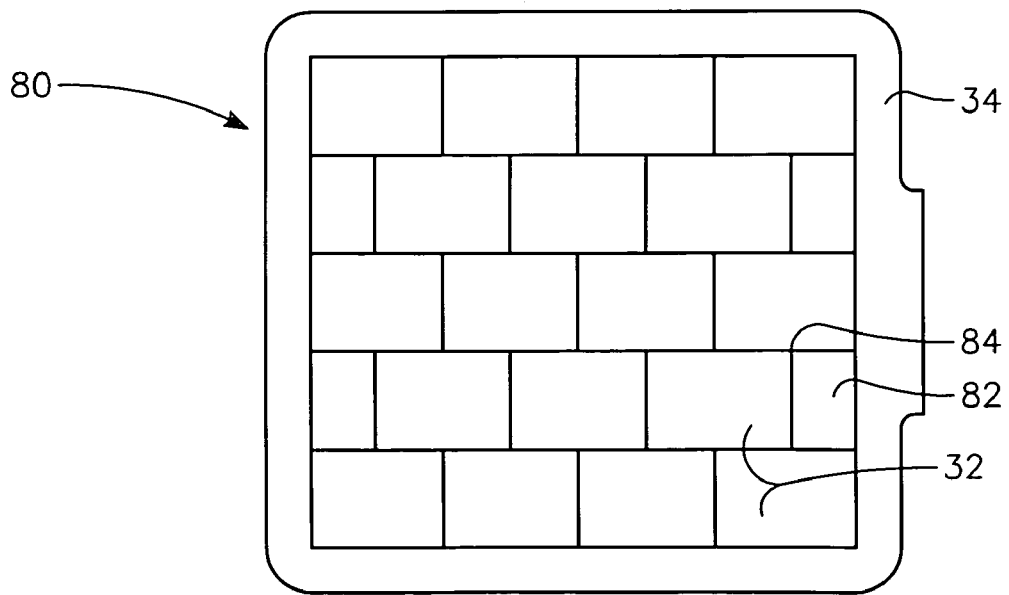
FIG. 6 is a plan view of a first embodiment of the invention including rectangular target tiles arranged in staggered rows.

Targets made according to the invention avoid many of the problems of conventional targets composed of tiles arranged in a rectangular array having a rectangular shape or outline. Instead, as illustrated in the plan view of FIG. 6, a target 80 of one embodiment of the invention includes rectangular tiles 32 each of substantially the same composition at least on its sputtering face and ranged in staggered rows and bonded to the target backing plate 34. In this embodiment, the tiles 32 of one row are offset in the row direction from the tiles 32 of the neighboring rows. In some of the rows, end tiles 82 have a length in the row direction that is only a fraction of the corresponding length of full tiles 32. In this embodiment, it is preferred that the length of the end tiles 82 be one-half the full length less the desired size of the gap between tiles so that only two sizes of tiles 32, 82 are needed. While the tiles 32, 82 can still slide in the row direction during their transfer to and bonding with the backing plate 34, movement in the perpendicular direction is quite limited. As a result, interstices 84 at the corners between tiles 32, 82 are much less likely to grow to abnormally large sizes. Furthermore, each interstix 84 forms between three tiles 32, 82 and only two of the tiles 32, 82 present acute angles to the interstix 84. Accordingly, plasma arcing is less severe than wit four tiles presenting four acute angles, as in the prior art target 30 of FIG. 1.

The target 80 contains some rows containing a number N of whole tiles 32 alternating with rows containing N−1 whole tiles 32 and two half tiles 82. Within a factor that is a ratio of the number of rows and number of columns, the aspect ratio of the whole tiles 32 determines the aspect ratio of the useful target area covered by the tile 32, 82.

Figure 7:
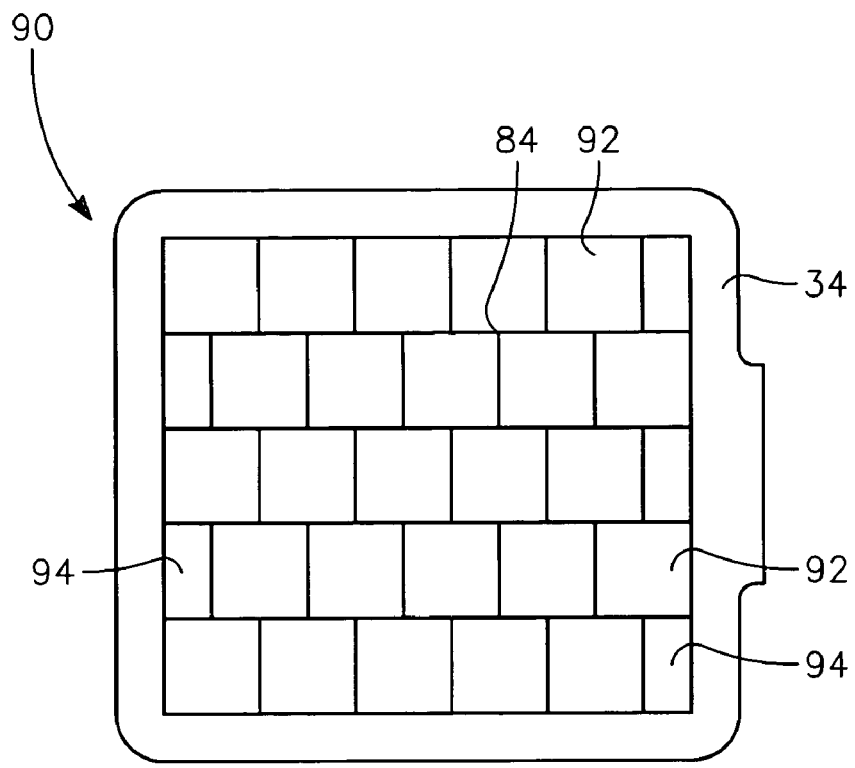
FIG. 7 is a plan view of a second embodiment including rectangular tiles arranged in staggered rows with partial end tiles of the same size arranged on opposing ends of neighboring rows.

A closely related target 90 illustrated in plan view in FIG. 7 has rectangular tiles 92 arranged in rows all containing N full tiles 92 and one partial rectangular tile 94. The partial tiles 94 are arranged on opposite ends of neighboring rows and may have the same length in the row direction so that only two sizes of tiles are required. The length of the partial tiles 94 in the row direction is not limited to one-half the corresponding length of the full tiles 92. Even if the full tiles 92 are square, the aspect ratio of the useful area of the target can be nearly freely chosen by varying the row dimension of the partial tiles 94.

In both the targets 80, 90, the full tiles 32 are arranged in a parallelogram arrangement of similarly oriented tiles 32.

Figure 8:
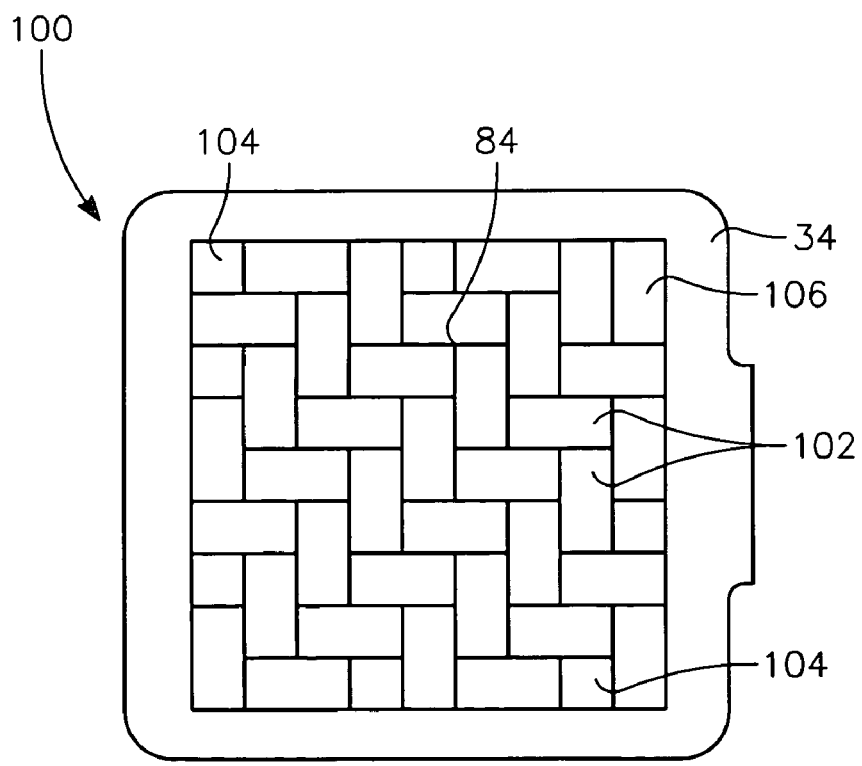
FIG. 8 is a plan view of a third embodiment including rectangular tiles arranged in a herringbone or zig-zag pattern.

A target 100 of a third embodiment of the invention is illustrated in FIG. 8 has rectangular tiles arranged in a herringbone arrangement, alternatively called a zig-zag arrangement. Viewed in the orientation of FIG. 8, the herringbone pattern includes tiles 102 having an 1:2 aspect ratio, taking into account any desired gap between the tiles 102. In the herringbone pattern, the tiles 102 are arranged in both the vertical and horizontal directions with paths passing through the short dimension of a first tile on a first end, through the long dimension of a second tile, and then through the short dimension of a third tile on a second end opposite the first end of the second tile. Thereafter, the pattern repeats. Viewed along the direction of the diagonal passing from lower left to upper right, there are parallel chevron patterns along the diagonal of pairs of orthogonally arranged tiles 102. The edges around the rectangular pattern require several half tiles 104. Note that a whole tile 106 at the upper right corner replaces two half tiles of the precise herringbone pattern.

The herringbone pattern provides many interlocking corners and thus allows little slippage to accumulate. This rigidity is accomplished with only two sizes of tiles. However, there is very little flexibility in the aspect ratio of the tiles in the simple illustrated herringbone pattern so that the overall aspect ratio of the useful area of the target is constrained to ratios of small integers. The target aspect ratio can be more freely chosen if rectangularly shaped target tiles of nearly arbitrary aspect ratio are lined up on one of the edges of the herringbone pattern. (A similar edge row of differently sized tiles may be used with the other rectangular arrangements to more easily attain an arbitrary aspect ratio.) The herringbone pattern can be characterized as pairs of perpendicularly oriented 1:2 tiles arranged in an parallelogram pattern.

In all the rectangular embodiments described above with reference to FIGS. 6, 7, and 8, a tile in the interior of the two-dimensional array away from the periphery abuts along a line six other tiles, whether they be full or partial tiles in contrast to the four tiles abutted in the prior art rectangular arrangement of FIG. 1.

Figure 9:
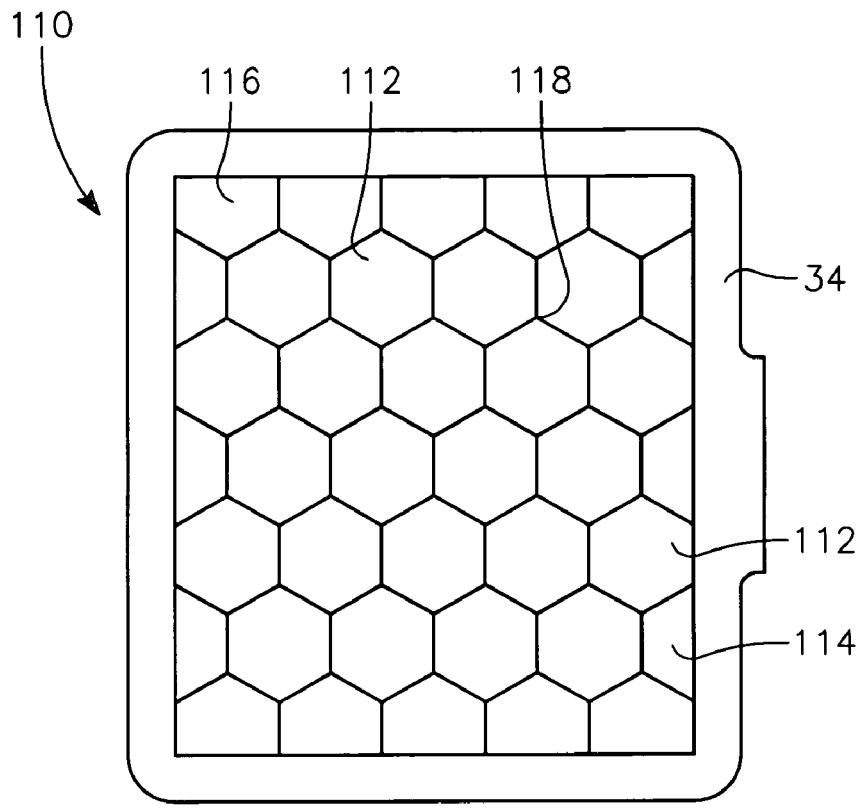
FIG. 9 is a plan view of a fourth embodiment including hexagonal tiles.

All the previously described patterns involve rectangular tiles. In contrast, a target 110 illustrated in plan view in FIG. 9 includes regular hexagonal tiles 112 arranged in a hexagonal close packed structure, alternatively characterized as a rhombohedral pattern with one pair of sides aligned with the rectangular outline. It is not conventional to fabricate tiles in non-rectangular shapes. However, targets of many high-temperature metals are formed by sintering powders in a mold. The mold can be shaped in the required non-rectangular shape, in this embodiment a hexagonal shape. Fitting the hexagonal tiles 122 into a rectangular shape requires extra edge pieces. However, in the design of FIG. 9, the edge pieces can be restricted to tiles of two shapes, trapezoidal tiles 114 along set of opposed edges, which are half hexagons, and pentagonal tiles 116 along the other set of opposed edges. Although the illustrated hexagons are regular, they may be stretched or shrunk along one opposed pair of sides with all interior corners maintained at 60°. Even with regular hexagons having a fixed aspect ratio, the length of the parallel sides of the pentagonal tiles 106 may be varied to provide more freedom in the overall target aspect ratio. The limitation to three sizes of tiles 112, 114, 116 is obtained when there are an odd number of rows in the illustrated orientation of an odd number of abutting hexagon tiles 112, one of which may be split into two trapezoidal tiles 114 for the edges. The hexagonal arrangement produces interstices 118 abutting three tiles 112 (including edge tiles 114, 116 as appropriate). Each of the abutting tiles abuts at corners having an exterior obtuse angle of 120°. Similarly to the rectangular patterns of the invention, each hexagonal tile 112 in the interior of the arrangement abuts along a line six other tiles, whether they be full or partial tiles.

The rectangular and hexagonal tiles described above have interior angles of 90° and 60° respectively. It is possible to modify these shapes to more oblique shapes. As long as the opposed sides of the tiles are parallel, they can be close packed. However, such oblique shapes require additional edge pieces.

Figure 10:
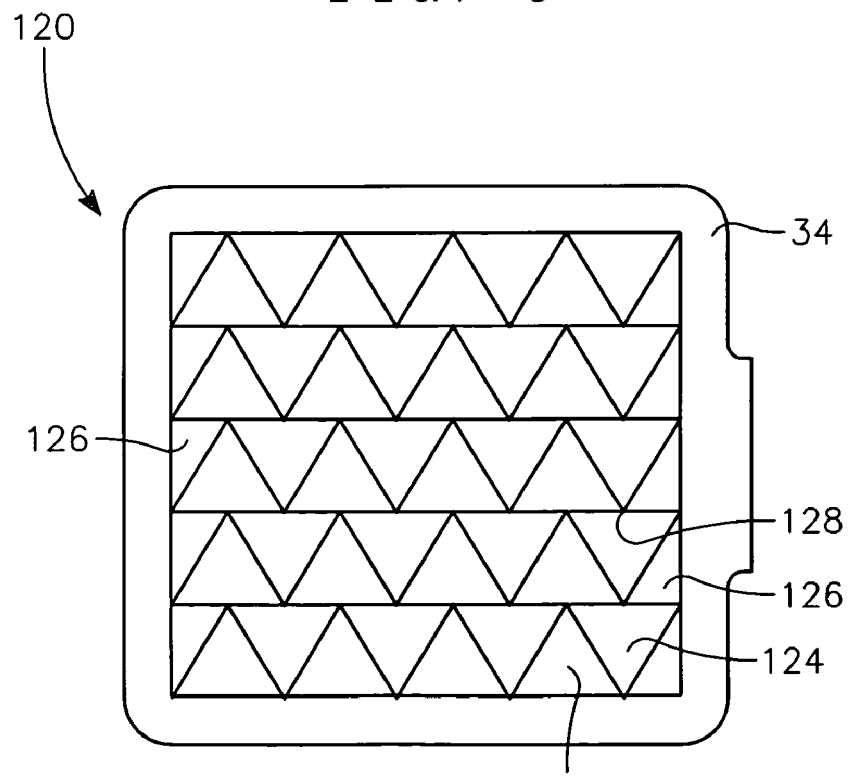
FIG. 10 is a plan view of a fifth embodiment including triangular tiles.

Another target 120 illustrated in plan view in FIG. 10 includes triangular tiles. In the illustrated embodiment, each row includes alternating triangular tiles 122, 124 of the same shape of an isosceles triangle but with inverted orientations with respect to the perpendicular of the horizontally illustrated row direction. Two right triangular tiles 126 are disposed at the end of the rows to provide the desired overall rectangular shape. If there are matched pairs of tiles 122, 124 in each row, that is, N of each, then the right triangular end tiles 128 have the same shape even if their tops and bottoms need to be differentiated. As a result, only two sizes of tiles 122, 124 and 126 are required. The vertically oriented vertex of one isosceles tile 124, 126 abuts the base of another similar oriented isosceles tile 124, 126 so that interior interstices 128 are bordered by three acute apexes and one flat side of four respective tiles 124, 126. If the isosceles triangles of the tiles 124, 126 are equilateral triangles, the minimum apex angle is increased and the perimeter-to-area ratio decreased. However, an equilateral design provides little flexibility in overall aspect ratio of the target while a more general isosceles design allows different base-to-side ratios in the triangles. In the illustrated triangular arrangement, each tile 122 or 124 at the interior of the pattern abuts along a line four other triangular tiles, whether they be full or partial. It may be desirable to line one edge of the triangular array, whether isosceles or equilateral, with rectangular tiles of arbitrary aspect ratio to thereby allow an arbitrary target aspect ratio.

The illustrated triangular arrangement can be characterized as a rectangular arrangement of non-rectangular elements although non-rectangular arrangements are possible. In any case, all the embodiments described above include a two-dimensional array of tiles arranged and bonded to the backing plate such that the edges of the tiles do not conform to a rectangular two-dimensional grid, as do the tiles of the prior art arrangement of FIG. 2.

Other triangular shapes and staggering patterns are possible, but the isoceles design of FIG. 10 provides a large minimum apex angle and a small number of extra edge pieces.

The invention is useful not only for refractory metal targets such as molybdenum, chromium, and tungsten as well as silicon, targets of which are difficult to fabricate in large sizes. Similarly, the invention is also useful for targets of more complex composition, such as indium tin oxide (ITO), which is typically sputtered from a target of a mixture of indium oxide and tin oxide in the presence of an oxygen ambient. Nonetheless, the invention is also useful for more common metals such as aluminum, copper, and titanium, particularly when a target backing plate is used which is intended to be refurbished. That is, the invention is not limited to the composition of the target The invention may further be applied to targets used in RF sputtering, such as insulating targets, as may be used for sputtering metal oxides. A magnetron is not essential for the invention. Furthermore, the invention can be applied to round targets although a large variety of edge pieces are required.

Although the invention has been described on the basis of planar bodies having straight sides, it is understood that the edges may have cross-sections of more complexity, such as steps, as long as the overall shape is describable as rectangular, etc. Similarly, the corners of the shape may be somewhat rounded, either intentionally or unintentionally.

The invention is most useful for large rectangular targets having minimum dimensions of greater than 1.8 m. However, the invention is applicable to smaller targets for which tiling is still desired. Especially for smaller targets, the target backing plate may be simpler than the one illustrated and not include the cooling channels.

The invention thus provides less tile misalignment and improved sputtering performance with only a small increase in the complexity of the tiled target and its fabrication.

The invention claimed is:

1. A tiled sputtering target, comprising:
a target backing plate;
a plurality of tiles comprising a common sputtering composition, fixed to said plate, and arranged in a two-dimensional array, wherein said tiles excluding some of those disposed on a periphery of said array have hexagonal shapes.

2. A tiled sputtering target, comprising:
a target backing plate;
a plurality of tiles comprising a common sputtering composition, fixed to said plate, and arranged in a two-dimensional array, wherein said tiles of said array disposed away from a periphery of the array have a first triangular shape and some of said tiles disposed on the periphery have a second different triangular shape.

3. The target of claim 2, wherein each of said tiles excluding those disposed on said periphery abuts four others of said tiles.

4. The target of claim 2, wherein said first triangular shape is an isosceles triangular shape.

5. A plasma sputtering reactor, comprising:
a vacuum chamber;
a support for supporting a rectangular substrate to be sputter coated;
a target backing plate vacuum sealed to said chamber in opposition to said support; and
a plurality of tiles comprising a common sputtering composition, fixed to said plate, and arranged in a two-dimensional array, wherein said tiles excluding some of those disposed on a periphery of said array have hexagonal shapes;
wherein the target backing plate and the tiles form a target configured to be biased by a single power supply.

6. A plasma sputtering reactor, comprising:
a vacuum chamber;
a support for supporting a rectangular substrate to be sputter coated;
a target backing plate vacuum sealed to said chamber in opposition to said support; and
a plurality of tiles comprising a common sputtering composition, fixed to said plate, and arranged in a two-dimensional array inside a rectangular outline, wherein said tiles of said array disposed away from a periphery of the array have a first triangular shape and some of said tiles disposed on the periphery have the second different triangular shape;
wherein the target backing plate and the tiles form a target configured to be biased by a single power supply.

7. A method of sputtering, comprising the steps of:
affixing to a sputtering chamber a target backing plate to which are affixed a plurality of tiles of a common sputtering material in a two-dimensional array inside a rectangular outline, wherein all of the tiles except some of those at a periphery of the away have hexagonal shapes; and
exciting a sputter working gas within said chamber into a plasma to sputter said tiles and deposit said material onto a substrate disposed in opposition to said target backing plate.

8. A method of sputtering, comprising the steps of:
affixing to a sputtering chamber a target backing plate to which are affixed a plurality of tiles of a common sputtering material in a two-dimensional array inside a rectangular outline, wherein said tiles of the array disposed away from the periphery of the array have a first triangular shape and some of the tiles disposed on the periphery have a second different triangular shape; and
exciting a sputter working gas within said chamber into a plasma to sputter said tiles and deposit said material onto a substrate disposed in opposition to said target backing plate.

* * * * *